US012718900B2

(12) United States Patent
Chai

(10) Patent No.: US 12,718,900 B2
(45) Date of Patent: Aug. 25, 2026

(54) SEMICONDUCTOR MEMORY APPARATUS AND METHOD FOR CONTROLLING A SEMICONDUCTOR MEMORY APPARATUS VERIFICATION OPERATION

(71) Applicant: SK hynix Inc., Icheon-si (KR)

(72) Inventor: Soo Yeol Chai, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 78 days.

(21) Appl. No.: 18/767,635

(22) Filed: Jul. 9, 2024

(65) Prior Publication Data

US 2025/0279145 A1 Sep. 4, 2025

(30) Foreign Application Priority Data

Feb. 29, 2024 (KR) ........................ 10-2024-0029800

(51) Int. Cl.
*G11C 16/24* (2006.01)
*G11C 16/26* (2006.01)
*G11C 16/34* (2006.01)

(52) U.S. Cl.
CPC .......... *G11C 16/3459* (2013.01); *G11C 16/24* (2013.01); *G11C 16/26* (2013.01)

(58) Field of Classification Search
CPC ..... G11C 16/3459; G11C 16/24; G11C 16/26; G11C 11/5628; G11C 16/10; G11C 16/3404; G11C 16/3418
See application file for complete search history.

(56) References Cited

U.S. PATENT DOCUMENTS 11,276,475 B2 3/2022 Choi
2008/0159005 A1* 7/2008 Lee ........................ G11C 16/26 365/185.25

FOREIGN PATENT DOCUMENTS

KR 1020170102659 A 9/2017

* cited by examiner

*Primary Examiner* — Xiaochun L Chen

(74) *Attorney, Agent, or Firm* — WILLIAM PARK AND ASSOCIATES LTD.

(57) ABSTRACT

A semiconductor memory apparatus includes a plurality of bit lines, a plurality of page buffers, and a page buffer control circuit. The plurality of page buffers are each coupled with the plurality of bit lines and operate in response to a plurality of page buffer control signals. The page buffer control circuit generates the plurality of page buffer control signals to perform program and verification operations comprising a plurality of loops. The page buffer control circuit uses the plurality of page buffer control signals to simultaneously precharge bit lines coupled with page buffers, among the plurality of page buffers, corresponding to a plurality of verification levels corresponding to each of the plurality of loops.

22 Claims, 7 Drawing Sheets

PRIOR ART
FIG. 2

WL
PGM1
LP1
MV1
PV1
PV2
PGM7
LP7
MV7
PV1
PV2
PV3
PGM15
LP15
MV15
PV1
PV2
PV3

FIG. 6

| DATA LATCH | PV0 | PV1 | PV2 | PV3 |
|---|---|---|---|---|
| Q2_N (MSB) | 1 | 0 | 0 | 1 |
| Q1_N (LSB) | 1 | 1 | 0 | 0 |

WL
PGM1
LP1
MV1
PV1
PV2
PGM7
LP7
MV7
PV1
PV2
PV3
PGM15
LP15
MV15
PV2
PV3

SEMICONDUCTOR MEMORY APPARATUS AND METHOD FOR CONTROLLING A SEMICONDUCTOR MEMORY APPARATUS VERIFICATION OPERATION

CROSS-REFERENCES TO RELATED APPLICATION

The present application claims priority under 35 U.S.C. § 119(a) to Korean application number 10-2024-0029800 filed on Feb. 29, 2024, in the Korean Intellectual Property Office, which application is incorporated herein by reference in its entirety.

BACKGROUND

1. Technical Field

Various embodiments generally relate to a semiconductor circuit, and, more particularly, to a semiconductor memory apparatus and a method for controlling a semiconductor memory apparatus verification operation.

2. Related Art

Typical semiconductor memory apparatus, such as a flash memory, requires program and verification operations and read operation to store data.

The program operation may include a sub-program operation to increase threshold voltages of memory cells included in a memory block, and a verification operation to determine whether the threshold voltages of the memory cells have reached a target voltage. The program operation may be performed in an incremental step pulse programming (ISPP) method, in which a program voltage applied to word lines connected to the memory cells is increased in steps. For example, the sub-program operation and the verification operation may form a single loop, and the program operation may perform multiple loops. Each time a loop is executed, the program voltage can be increased by a step voltage.

The read operation may include sensing the memory cells using a read voltage, and outputting the sensed data from the memory cells to an external device. The external device may be a controller that transmits commands and addresses to the memory apparatus.

To further improve the integration of flash memory, there is active research on multi-bit cells that allow multiple data to be stored in a single memory cell. Memory cells can store one, two, or more bits of data depending on how they are programmed. For example, when one bit of data is stored in a memory cell, it is called a single level cell method, when two bits of data are stored in a memory cell, it is called a multi-level cell (MLC) method, when three bits of data are stored in a memory cell, it is called a triple level cell method, and when four bits of data are stored in a memory cell, it is called a quad level cell method. In addition, more than four bits of data can be stored in a single memory cell.

FIG. 1 is a threshold voltage distribution diagram of a typical 2-bit MLC.

Referring to FIG. 1, an MLC capable of storing 2 bits of data is shown in the threshold voltage distribution diagram divided into four distributions. It represents threshold voltage distributions of unprogrammed [11] state, and programmed [01], [00], and [10] states.

In state [01], a program operation is verified to pass or fail by a first sub-verification operation using a first verification level PV1, i.e., a verification voltage of a first level. In state [00], a program operation is verified to pass or fail by a second sub-verification operation using a second verification level PV2, i.e., a verification voltage of a second level higher than the first level. In state [10], a program operation is verified to pass or fail by a third sub-verification operation using a third verification level PV3, i.e., a verification voltage of a third level higher than the second level. On the other hand, memory cells with threshold voltage distribution in state [11] do not require verification operation because they have not been programmed or have been erased after programming. However, for simplicity of explanation, a verification level corresponding to memory cells with threshold voltage distributions in the state will be referred to as a verification-free level PV0.

This method of programming is a programming method using gray code, which indicates a method of programming so that only one bit is changed among the bits comprising the data. In other words, in the case of FIG. 1 above, the value of '1' is changed to '0' only, and only one bit can be changed with a single program. This applies not only to two bits, but also to MLCs that can store n number of bits, so even if an error occurs in a single cell, at least one bit will be changed, which is why the gray code method is used.

Figure 2:
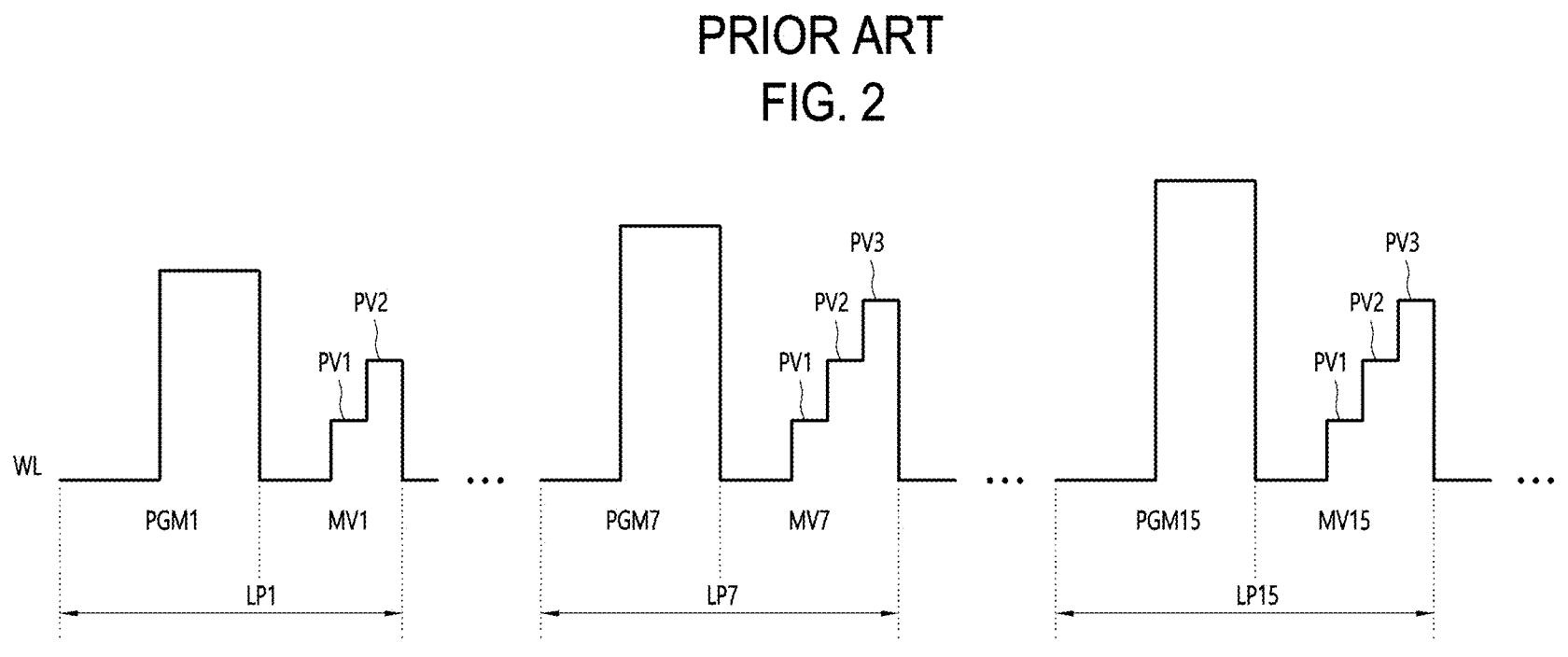

FIG. 2 is a diagram illustrating conventional program and verification operations.

Referring to FIG. 2, the conventional program operation may include a plurality of loops LP1, LP2, . . . , LP15, . . . . The loops are executed until threshold voltages of the selected memory cells reaches a target voltage, and if a verification voltage fails until the number of times the loop is executed reaches a threshold value, the selected memory block is treated as a bad block.

Each of the loops includes a sub-program operation and a main verification operation. Taking a first loop LP1 as an example, the first loop LP1 includes a first sub-program operation PGM1 and a first main verification operation MV1. In the first sub-program operation PGM1, a program voltage is applied to a selected word line WL to increase threshold voltages of the memory cells.

In the first main verification operation MV1, a plurality of sub-verification operations are performed, for example, a first sub-verification operation and a second sub-verification operation utilizing a first verification level PV1 and a second verification level PV2, respectively.

Following the first main verification operation MV1, other loops are performed sequentially. For example, in the seventh loop LP7, the seventh sub-program operation PGM7 and the seventh main verification operation MV7 are performed. In the seventh main verification operation MV7, first to third sub-verification operations utilizing a first verification level PV1, a second verification level PV2, and a third verification level PV3, respectively, are performed.

The plurality of loops LP1, LP2, . . . , LP15, . . . are performed in the manner described above.

To perform each of the main verification operations included in the plurality of loops LP1, LP2, . . . , LP15, . . . , a bit line precharge operation is required, and one of an all bit line precharge method and a selective bit line sequential precharge method is used.

The all bit line precharge method precharges all bit lines regardless of the number of verification levels, i.e., for the first main verification operation MV1, only the first verification level PV1 and the second verification level PV2 are utilized, but regardless, all bit lines corresponding to the first through third verification levels PV1-PV3 are included, as well as bit lines corresponding to the verification-free level PV0. Therefore, the all bit line precharge method increases current consumption as all bit lines are precharged, resulting in a decrease in operational performance due to peak current.

The selective bit line sequential precharge method sequentially precharges and discharges each of the sub-verification operations. For example, in the first sub-verification operation of the seventh loop LP7, only the bit lines corresponding to the first verification level PV1 are selected from all bit lines to be precharged and discharged after verification. Then, in the second sub-verification operation, only the bit lines corresponding to the second verification level PV2 are selected from all bit lines to be precharged and discharged after verification. Then, in the third sub-verification operation, only bit lines corresponding to the third verification level PV3 are selected from all bit lines to be precharged and discharged after verification. The above operations are repeated for each of the plurality of loops LP1, LP2, . . . , LP15, . . . . Therefore, the selective bit line sequential precharge method increases the bit line setup time as it selects only the bit lines corresponding to the verification level and repeats the precharge and discharge, and the bit line setup time increases further as the memory capacity increases, and eventually the verification time increases, which degrades the product operation performance.

SUMMARY

In an embodiment, a semiconductor memory apparatus may include a plurality of bit lines, a plurality of page buffers, and a page buffer control circuit. The plurality of page buffers may each be coupled with the plurality of bit lines and may be configured to operate in response to a plurality of page buffer control signals. The page buffer control circuit may be configured to generate the plurality of page buffer control signals to perform program and verification operations comprising a plurality of loops. The page buffer control circuit may be configured to use the plurality of page buffer control signals to simultaneously precharge bit lines coupled with page buffers, among the plurality of page buffers, corresponding to a plurality of verification levels corresponding to each of the plurality of loops.

In an embodiment, a semiconductor memory apparatus may include a bit line, a data latch set, a sensing information latch, a backup latch, a precharge selection information latch, and a page buffer control circuit. The bit line may be coupled to a sensing node through at least one switch. The data latch set may be coupled with the sensing node and may include a plurality of data latches, each data latch from the plurality of data latches configured to store at least one bit of data. The sensing information latch may be coupled with the sensing node, and may be configured to store as sensing information whether a plurality of sub-verification operations corresponding to a plurality of verification levels pass or fail. The backup latch may be coupled with the sensing node and may be configured to store the sensing information as backup information. The precharge selection information latch may be coupled with the sensing node and may be configured to store precharge selection information. The page buffer control circuit may be configured to control the data latch set and the backup latch such that the backup information is reset in accordance with the data, may be configured to control the backup latch and the precharge selection information latch such that the backup information is stored as the precharge selection information, and may be configured to control the at least one switch to precharge the bit line in accordance with the precharge selection information.

In an embodiment, a semiconductor memory apparatus may include a plurality of bit lines, a plurality of page buffers, and a page buffer control circuit. A sensing node of the plurality of page buffers may be coupled to the plurality of bit lines through at least one switch. The plurality of page buffers may be configured to store data, backup information, sensing information, and precharge selection information in response to a plurality of page buffer control signals. The page buffer control circuit may be configured to generate the plurality of page buffer control signals to perform program and verification operations comprising a plurality of loops. The page buffer control circuit may be configured to perform a bit line setup operation including at least one of a preliminary setup operation and a main setup operation to select page buffers corresponding to a plurality of verification levels among the plurality of page buffers, and may be configured to perform a plurality of sub-verification operations utilizing each of the plurality of verification levels while simultaneously precharging bit lines coupled with page buffers corresponding to the plurality of verification levels among the plurality of bit lines.

In an embodiment, a method for controlling a verification operation of a semiconductor memory apparatus comprising a plurality of bit lines; a plurality of page buffers each coupled with the plurality of bit lines and configured to store data, backup information, sensing information and precharge selection information; and a page buffer control circuit configured to control the plurality of page buffers to perform program and verification operations comprising a plurality of loops may include performing a preliminary setup operation of resetting the backup information based on the data; performing a main setup operation of storing the backup information as the precharge selection information; and performing a selective bit line simultaneous precharge operation to simultaneously precharge bit lines coupled with page buffers corresponding to a plurality of verification levels corresponding to each of the plurality of loops among the plurality of page buffers according to the precharge selection information.

BRIEF DESCRIPTION OF THE DRAWINGS

FIG. 2 is a diagram illustrating conventional program and verification operations.

FIG. 6 is a diagram illustrating an embodiment of data stored in the page buffer of FIG. 5 and verification levels.

DETAILED DESCRIPTION

Various embodiments of the present disclosure can improve operational performance by reducing current consumption and verification time due to a bit line precharge operation.

Hereinafter, embodiments of the present disclosure will be described with reference to the accompanying drawings.

Figure 1:
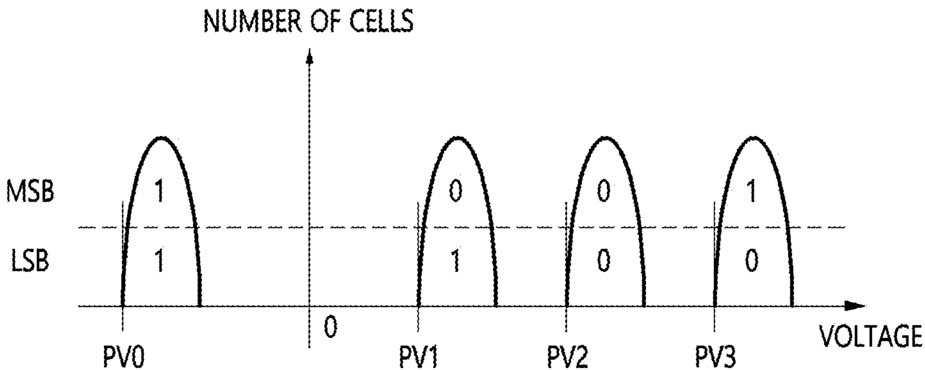
FIG. 1 is a threshold voltage distribution diagram of a typical 2-bit MLC.
Figure 3:
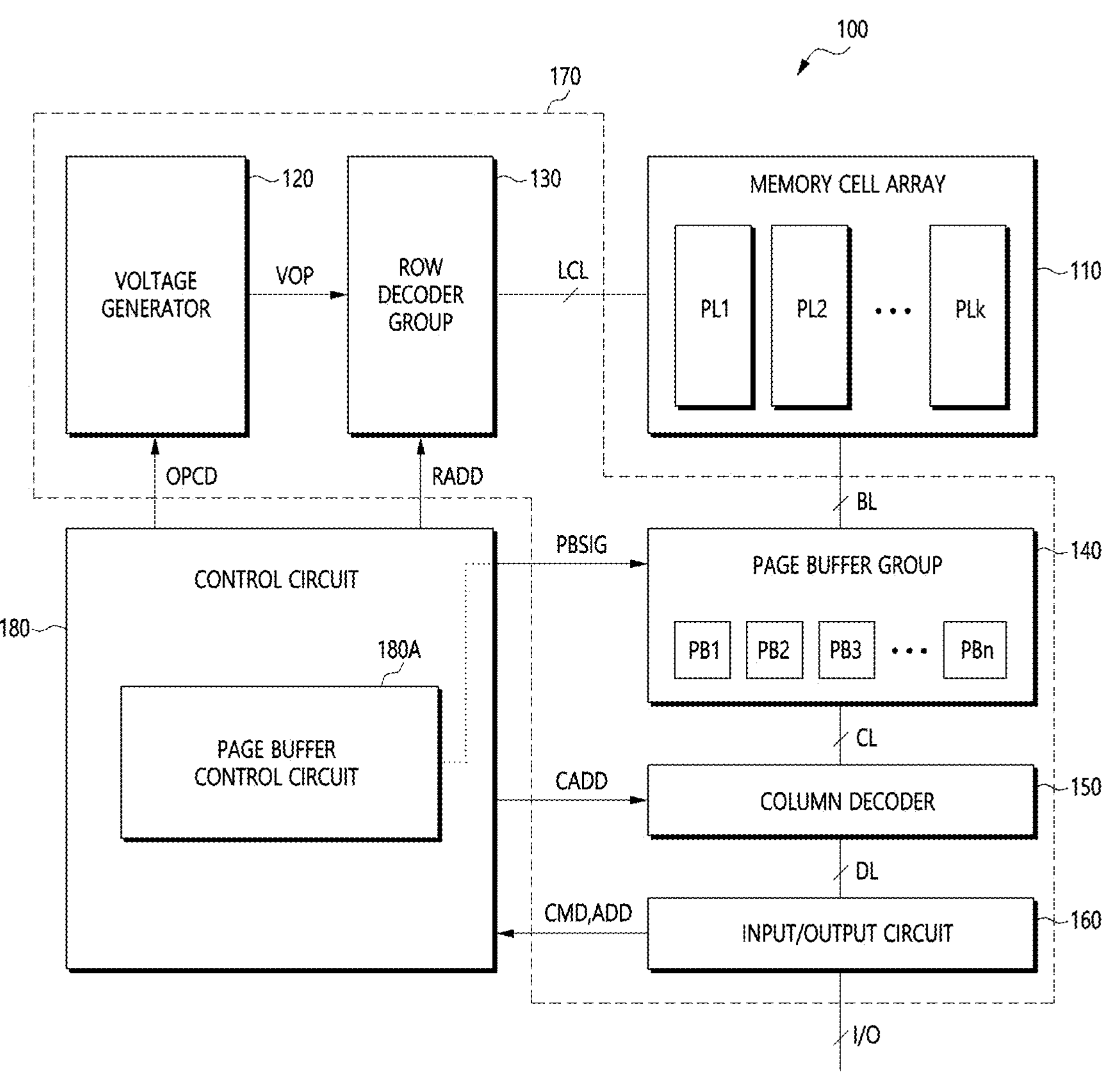
FIG. 3 is a diagram illustrating a configuration of a semiconductor memory apparatus according to an embodiment of the present disclosure.

FIG. 3 is a diagram illustrating a configuration of a semiconductor memory apparatus 100 according to an embodiment of the present disclosure.

Referring to FIG. 3, the semiconductor memory apparatus 100 may include a memory cell array 110, a peripheral circuit 170, and a control circuit 180.

The memory cell array 110 may include at least one plane. For example, the memory cell array 110 may include first to kth planes PL1-PLk. Each of the first to kth planes PL1-PLK may include memory blocks. The memory blocks may be formed in a two-dimensional structure or a three-dimensional structure. Memory blocks having a two-dimensional structure may include memory cells arranged parallel to a substrate. Memory blocks with a three-dimensional structure may include memory cells stacked perpendicular to the substrate. The memory cells may store one bit, two bits, or more bits of data depending on a program method.

The peripheral circuit 170 may be configured to perform program operations to store data in the memory cell array 110, read operations to output data stored in the memory cell array 110, and erase operations to erase data stored in the memory cell array 110. For example, the peripheral circuit 170 may include a voltage generator 120, a row decoder group 130, a page buffer group 140, a column decoder 150, and an input/output circuit 160.

The voltage generator 120 may generate various operating voltages VOP that are used for a program operation, a read operation, or an erase operation in response to an operation code OPCD. For example, the voltage generator 120 may be configured to generate a program voltage, a pass voltage, a turn-on voltage, a turn-off voltage, a ground voltage, a verification voltage, a read voltage, an erase voltage, and the like in response to the operation code OPCD. The program voltage is a voltage applied to a selected word line during a program operation, which may be used to raise threshold voltages of memory cells. The pass voltage is a voltage applied to unselected word lines during a program operation or a read operation, which may be used to turn on unselected memory cells. The turn-on voltage is a voltage applied to a drain selection line or a source selection line, which can be used to turn on a drain selection transistor or a source selection transistor. The turn-off voltage is a voltage applied to the drain selection line or the source selection line, which may be used to turn off the drain selection transistor or the source selection transistor. The ground voltage may be zero voltage. The verification voltage is a voltage applied to selected word lines or all word lines coupled to a selected memory block to determine threshold voltages of the selected memory cells during a program operation or an erase operation. The read voltage is a voltage applied to selected word lines during a read operation, which may be used to determine the data stored in the memory cells. The erase voltage is a voltage applied to source lines during an erase operation, which may be used to lower threshold voltages of the memory cells.

The row decoder group 130 may be configured to transmit the operating voltages VOP to local lines LCL coupled to selected memory blocks according to row addresses RADD. For example, the row decoder group 130 may be coupled to the voltage generator 120 through global lines and to the first through kth planes PL1-PLk through local lines LCL. The row decoder group 130 may include a plurality of row decoders (not shown), each coupled to the first to kth planes PL1-PLk. Each of the plurality of row decoders (not shown) may be coupled to memory blocks included in the first to kth planes PL1-PLk through local lines LCL. The local lines LCL may include drain selection lines, word lines, source selection lines, and source lines.

The page buffer group 140 may include a plurality of page buffers PB1-PBn. The plurality of page buffers PB1-PBn may have the same circuit configuration. The plurality of page buffers PB1-PBn may be coupled to the memory cell array 110 through a plurality of bit lines BL. The plurality of page buffers PB1-PBn may regulate a level of voltage applied to the plurality of bit lines BL, and a duration for which voltage is applied to the bit lines BL, in response to a plurality of page buffer control signals PBSIG. The plurality of page buffers PB1-PBn may store externally supplied data in response to the plurality of page buffer control signals PBSIG. Among the plurality of page buffers PB1-PBn, the page buffers corresponding to remaining sub-verification operations other than the verified sub-verification operations, may simultaneously precharge the bit lines coupled with them. The plurality of page buffers PB1-PBn may determine the sub-verification operations corresponding to themselves according to the stored data. The plurality of page buffers PB1-PBn may precharge the corresponding bit lines by applying a precharge voltage to the corresponding bit lines for each of the sub-verification operations in response to the plurality of page buffer control signals PBSIG.

The column decoder 150 may be configured to transmit data between the page buffer group 140 and the input/output circuit 160 in response to column addresses CADD. For example, the column decoder 150 may be coupled to the page buffer group 140 through column lines CL and to the input/output circuit 160 through data lines DL.

The input/output circuit 160 may pass commands CMD and addresses ADD received from an external device (e.g., a controller) to the control circuit 180. In a program operation, the input/output circuit 160 may transmit data received from the external device to the column decoder 150. In read operation, the input/output circuit 160 may output data received from the column decoder 150 to the external device.

The control circuit 180 may output the operation code OPCD, the row addresses RADD, the page buffer control signals PBSIG, and the column addresses CADD in response to the commands CMD and the addresses ADD. The control circuit 180 may control the peripheral circuit 170 to perform an erase operation of the memory block selected by the addresses ADD when input command CMD defines an erase operation. The control circuit 180 may control the peripheral circuit 170 to perform a read operation of the memory block selected by the addresses and output read data if the input command CMD defines a read operation. The control circuit 180 may control the peripheral circuit 170 to perform program and verification operations of the selected memory block when the input command CMD defines a program operation.

The control circuit 180 may include a page buffer control circuit 180A. In response to the commands CMD, the page buffer control circuit 180A may generate the page buffer control signals PBSIG to regulate a level of voltage applied to the bit lines BL, or a duration for which voltage is applied to the bit lines BL. The page buffer control signals PBSIGs may include various signals for regulating voltages applied to the bit lines BL as well as circuits included in the plurality of page buffers PB1-PBn.

The page buffer control circuit 180A may regulate the page buffer control signals PBSIG such that an erase voltage is applied to the bit lines BL during an erase operation. The page buffer control circuit 180A may regulate the page buffer control signals PBSIG such that a precharge voltage is applied to the bit lines BL.

The page buffer control circuit 180A may regulate values of the page buffer control signals PBSIG such that during a program operation, a program-allow voltage is applied to selected bit lines of the bit lines BL and a program-disallow voltage is applied to unselected bit lines.

The page buffer control circuit 180A may control a program operation determined by data and a main verification operation including a plurality of sub-verification operations. The page buffer control circuit 180A may use the page buffer control signals PBSIG to control the page buffers corresponding to remaining sub-verification operations other than verified sub-verification operations among a plurality of sub-verification operations to simultaneously precharge the bit lines coupled with them, among the plurality of page buffers PB1-PBn.

Figure 4:
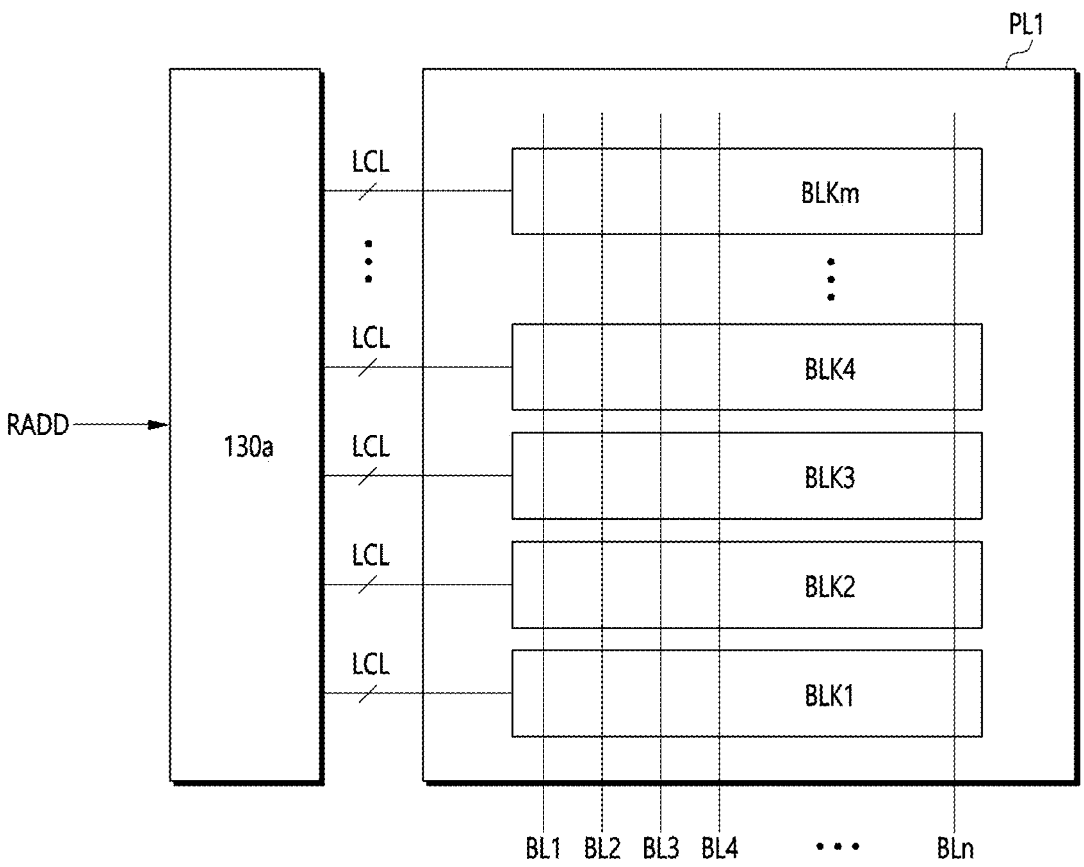
FIG. 4 is a diagram illustrating an embodiment of a connection configuration of memory blocks included in a plane of FIG. 3.

FIG. 4 is a diagram illustrating a connection configuration of memory blocks included in the plane of FIG. 3, using as an example the first through mth memory blocks BLK1-BLKm included in the first plane PL1.

Referring to FIG. 4, each of the first to mth memory blocks BLK1-BLKm may be coupled through local lines LCL to a first row decoder 130*a*, which is one of a plurality of row decoders included in the row decoder group 130. The first to mth memory blocks BLK1-BLKm may be in common coupled with a plurality of bit lines BL1-BLn. The first row decoder 130*a* may transmit operating voltages through local lines LCL coupled to selected memory blocks of the first to mth memory blocks BLK1-BLKm in response to the row addresses RADD. While program, read, or erase operation is performed on the selected memory blocks, the first row decoder 130*a* may float the local lines LCL coupled to non-selected memory blocks. The local lines LCL may include drain selection lines, word lines, source selection lines, and source lines, and may further include dummy lines.

Figure 5:
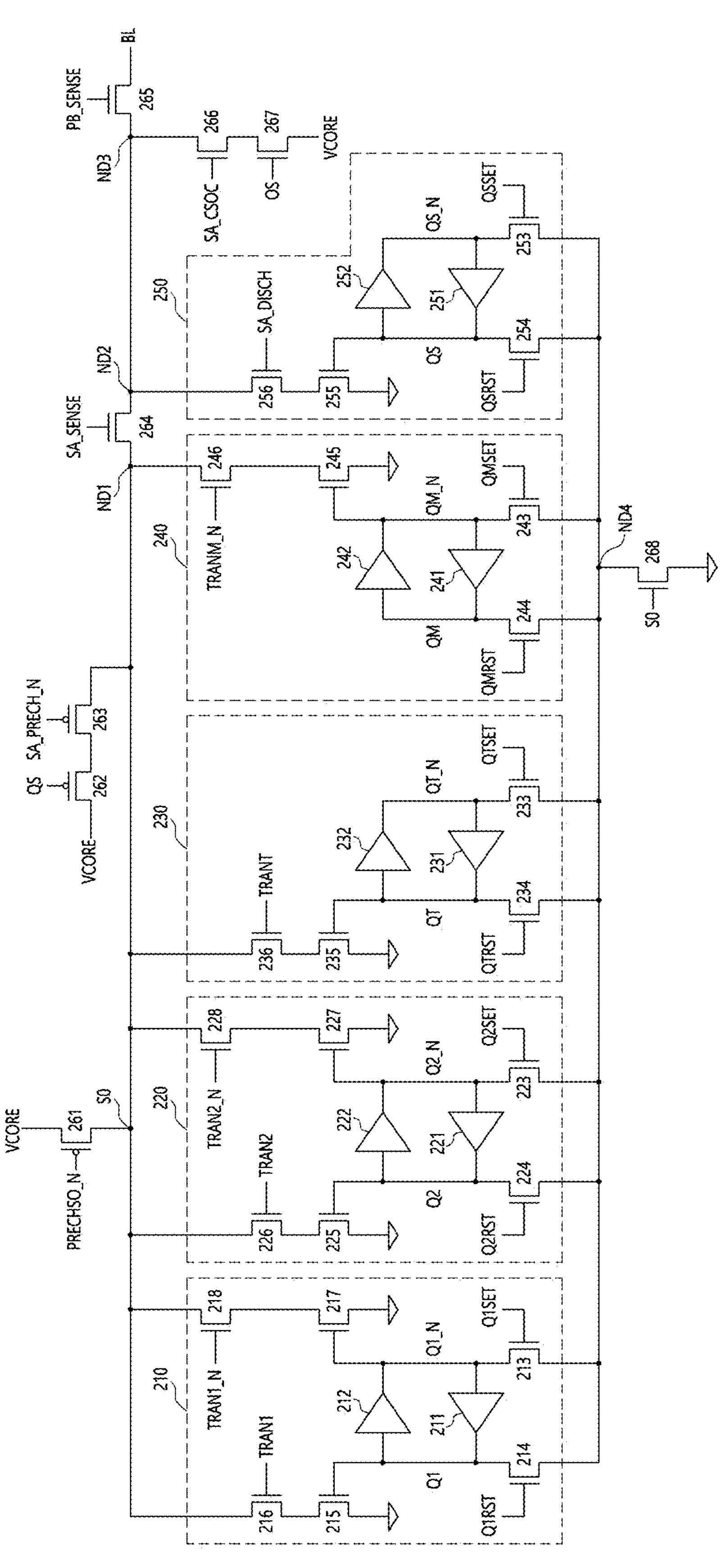
FIG. 5 is a diagram illustrating an embodiment of a configuration of a page buffer of FIG. 3.

FIG. 5 is a diagram illustrating a configuration of the page buffer PB1 of FIG. 3.

Referring to FIG. 5, the page buffer PB1 may include a data latch set 210, 220, a backup latch 230, a sensing information latch 240, a precharge selection information latch 250, and a plurality of switches, such as first to eighth switches 261-268.

The data latch set 210, 220, the backup latch 230, the sensing information latch 240, the precharge selection information latch 250, and the first to eighth switches 261-268 may be operable in response to the page buffer control signals PBSIG.

The first switch 261 may be coupled between a power terminal VCORE and a sensing node SO, and may be turned on in response to a first precharge control signal PRECHSO_N. The first switch 261 may precharge the sensing node SO to a voltage level of the power terminal VCORE when the first precharge control signal PRECHSO_N is at a first logic level, such as a low level. In the above description, an example of a case where the first logic level is a low level is given, but the first logic level is not limited to either a low level or a high level, and may change depending on a circuit design. For ease of description, the following discussion will assume that a first logic level is a low level and a second logic level is a high level.

The second switch 262 and the third switch 263 may be coupled between the power terminal VCORE and the sensing node SO. The second switch 262 may be turned on based on a logic level of a latch node QS of the precharge selection information latch 250. The third switch 263 may be turned on based on a logic level of the second precharge control signal SA_PRECH_N. The second switch 262 and the third switch 263 may precharge the sensing node SO to a voltage level of the power terminal VCORE when the latch node QS of the precharge selection information latch 250 and the second precharge control signal SA_PRECH_N are both at a low logic level.

The fourth switch 264 may be coupled between a first node ND1 and a second node ND2. The first node ND1 and the second node ND2 may have the same potential as the sensing node SO, differing only in physical location. The fourth switch 264 may be turned on in response to a first sensing control signal SA_SENSE. The fourth switch 264 may connect the first node ND1 and the second node ND2 when the first sensing control signal SA_SENSE is at a high level.

The fifth switch 265 may be coupled between a third node ND3 and a bit line BL. The fifth switch 265 may be turned on in response to a second sensing control signal PB_SENSE. The third node ND3 may have the same potential as the sensing node SO, with only the physical location being different.

The sixth switch 266 and the seventh switch 267 may be coupled between the third node ND3 and the power terminal VCORE. The sixth switch 266 may be turned on based on a logic level of a third sensing control signal SA_CSOC. The seventh switch 267 may be turned on based on a logic level of the latch node QS of the precharge selection information latch 250. The sixth switch 266 and the seventh switch 267 may precharge the third node ND3 to a voltage level of the power terminal VCORE when the third sensing control signal SA_CSOC is at a high level and a logic level of the latch node QS of the precharge selection information latch 250 is at a high level.

The eighth switch 268 may be coupled between a fourth node ND4 and a ground terminal. The eighth switch 268 may connect the fourth node ND4 to the ground terminal when the sensing node SO is at a high level.

The first to eighth switches 261-268 may each comprise a transistor.

The data latch set 210, 220, the backup latch 230, the sensing information latch 240, and the precharge selection information latch 250 may be coupled in parallel between the sensing node SO and the fourth node ND4. The data latch set 210, 220, the backup latch 230, the sensing information latch 240, and the precharge selection information latch 250 may each have one end coupled with the sensing node SO and the other end in common coupled with the eighth switch 268 through the fourth node ND4.

The data latch set 210, 220 may include a first data latch 210 and a second data latch 220, which are configured to store 2 bits of data to match a 2-bit MLC, as an example, but not by way of limitation. For example, if the memory cells of the memory cell array 110 are 3-bit triple-level cells, the data latch set may comprise three data latches, and if the memory cells are 4-bit quad-level cells, the data latch set may comprise four data latches.

The first data latch 210 may store one of two bits of data, such as LSB data, in response to a first transmission control signal pair TRAN1, TRAN1_N, a first set signal Q1SET, and a first reset signal Q1RST. The first data latch 210 may include a first inverter 211, a second inverter 212, and a plurality of transistors, such as first to sixth transistors 213-218. The first inverter 211 may have an output terminal coupled to a latch node Q1 and an input terminal coupled to a latch node Q1_N, such as one of a latch node pair Q1, Q1_N. The second inverter 212 may have an output terminal coupled with the latch node Q1_N and an input terminal coupled with the latch node Q1. The first transistor 213 may have a source terminal coupled to the fourth node ND4, a drain terminal coupled to the latch node Q1_N, and a gate terminal receiving the first set signal Q1SET as an input. The first transistor 213 may connect the latch node Q1_N with the fourth node ND4 when the first set signal Q1SET is at a high level. The first transistor 213 may make the latch node Q1_N a low level when the first set signal Q1SET is at a high level while the sensing node SO is at a high level. The second transistor 214 may have a source terminal coupled to the fourth node ND4, a drain terminal coupled to the latch node Q1, and a gate terminal receiving the first reset signal Q1RST as an input. The second transistor 214 may connect the latch node Q1 to the fourth node ND4 when the first reset signal Q1RST is at a high level. The second transistor 214 may make the latch node Q1 a low level when the first reset signal Q1RST is at a high level while the sensing node SO is at a high level. The third transistor 215 may have a drain terminal coupled to a ground terminal and a gate terminal coupled to the latch node Q1. The fourth transistor 216 may have a drain terminal coupled to a source terminal of the third transistor 215, a source terminal coupled to a sensing node SO, and a gate terminal receiving any one of the first transmission control signal pair TRAN1, TRAN1_N, for example, the first transmission control signal TRAN1, as an input. The third transistor 215 and the fourth transistor 216 may cause a logic level of the sensing node SO to be low when the latch node Q1 and the first transmission control signal TRAN1 are at a high level. The fifth transistor 217 may have a drain terminal coupled to the ground terminal and a gate terminal coupled to the latch node Q1_N. The sixth transistor 218 may have a drain terminal coupled to a source terminal of the fifth transistor 217, a source terminal coupled to a sensing node SO, and a gate terminal receiving the first transmission control signal TRAN1_N as an input. The fifth transistor 217 and the sixth transistor 218 may make a logic level of the sensing node SO a low level when the latch node Q1_N and the first transmission control signal TRAN1_N are at a high level.

The first data latch 210 may store LSB data at a low level by holding the latch node Q1_N at a low level in response to a first set signal Q1SET having a high level while the sensing node SO is at a high level. The first data latch 210 may store LSB data at a high level by holding the latch node Q1_N at a high level in response to a first reset signal Q1RST having a high level while the sensing node SO is at a high level. Because the latch node Q1 and the latch node Q1_N are complementary to each other and always maintain opposite logic levels, a logic level of one of the latch node pair Q1, Q1_N may be used as the LSB data, and the above description of determining a logic level of the LSB data based on a logic level of the latch node Q1_N is by way of example only, and vice versa is possible. The first data latch 210 may control a level of the sensing node SO using a logic level of the latch node Q1 when the first transmission control signal TRAN1 is at a high level, and may control a level of the sensing node SO using a logic level of the latch node Q1_N when the first transmission control signal TRAN1_N is at a high level.

The second data latch 220 may store one of two bits of data, such as MSB data, in response to a second transmission control signal pair TRAN2, TRAN2_N, a second set signal Q2SET, and a second reset signal Q2RST. The second data latch 220 may include a first inverter 221, a second inverter 222, and a plurality of transistors, such as first to sixth transistors 223-228. The first inverter 221 may have an output terminal coupled to a latch node Q2 and an input terminal coupled to a latch node Q2_N, such as one of a latch node pair Q2, Q2_N. The second inverter 222 may have an output terminal coupled with the latch node Q2_N and an input terminal coupled with the latch node Q2. The first transistor 223 may have a source terminal coupled to the fourth node ND4, a drain terminal coupled to the latch node Q2_N, and a gate terminal receiving the second set signal Q2SET as an input. The first transistor 223 may connect the latch node Q2_N with the fourth node ND4 when the second set signal Q2SET is at a high level. The first transistor 223 may make the latch node Q2_N a low level when the second set signal Q2SET is at a high level while the sensing node SO is at a high level. The second transistor 224 may have a source terminal coupled to the fourth node ND4, a drain terminal coupled to the latch node Q2, and a gate terminal receiving the second reset signal Q2RST as an input. The second transistor 224 may connect the latch node Q2 to the fourth node ND4 when the second reset signal Q2RST is at a high level. The second transistor 224 may make the latch node Q2 a low level when the second reset signal Q2RST is at a high level while the sensing node SO is at a high level. The third transistor 225 may have a drain terminal coupled to the ground terminal and a gate terminal coupled to the latch node Q2. The fourth transistor 226 may have a drain terminal coupled to a source terminal of the third transistor 225, a source terminal coupled to the sensing node SO, and a gate terminal receiving any one of the second transmission control signal pair TRAN2, TRAN2_N, for example, the second transmission control signal TRAN2, as an input. The third transistor 225 and the fourth transistor 226 may cause a logic level of the sensing node SO to be low when the latch node Q2 and the second transmission control signal TRAN2 are at a high level. The fifth transistor 227 may have a drain terminal coupled to the ground terminal and a gate terminal coupled to the latch node Q2_N. The sixth transistor 228 may have a drain terminal coupled to a source terminal of the fifth transistor 227, a source terminal coupled to a sensing node SO, and a gate terminal receiving the second transmission control signal TRAN2_N as an input. The fifth transistor 227 and the sixth transistor 228 may make a logic level of the sensing node SO a low level when the latch node Q2_N and the second transmission control signal TRAN2_N are at a high level.

The second data latch 220 may store MSB data at a low level by holding the latch node Q2_N at a low level in response to a second set signal Q2SET having a high level while the sensing node SO is at a high level. The second data latch 220 may store MSB data at a high level by holding the latch node Q2_N at a high level in response to a second reset signal Q2RST having a high level while the sensing node SO is at a high level. Because the latch node Q2 and the latch node Q2_N are complementary to each other and always maintain opposite logic levels, a logic level of one of the latch node pair Q2, Q2_N may be used as the MSB data, and the above description of determining a logic level of the MSB data based on a logic level of the latch node Q2_N is by way of example only, and vice versa is possible. The second data latch 220 may control a level of the sensing node SO using a logic level of the latch node Q2 when the second transmission control signal TRAN2 is at a high level, and may control a level of the sensing node SO using a logic level of the latch node Q2_N when the second transmission control signal TRAN2_N is at a high level.

The backup latch 230 may be configured to store sensing information, i.e., sensing information stored in the sensing information latch 240, as backup information. The backup latch 230 may backup the sensing information in response to a third transmission control signal TRANT, a third set signal QTSET, and a third reset signal QTRST. The backup latch 230 may include a first inverter 231, a second inverter 232, and a plurality of transistors, such as first to fourth transistors 233-236. The first inverter 231 may have an output terminal coupled to any one of a latch node pair QT, QT_N, for example, a latch node QT, and an input terminal coupled to a latch node QT_N. The second inverter 232 may have an output terminal coupled with the latch node QT_N and an input terminal coupled with the latch node QT. The first transistor 233 may have a source terminal coupled to the fourth node ND4, a drain terminal coupled to the latch node QT_N, and a gate terminal receiving the third set signal QTSET as an input. The first transistor 233 may connect the latch node QT_N to the fourth node ND4 when the third set signal QTSET is at a high level. The first transistor 233 may make the latch node QT_N a low level when the third set signal QTSET is at a high level while the sensing node SO is at a high level. The second transistor 234 may have a source terminal coupled to the fourth node ND4, a drain terminal coupled to the latch node QT, and a gate terminal receiving the third reset signal QTRST as an input. The second transistor 234 may connect the latch node QT to the fourth node ND4 when the third reset signal QTRST is at a high level. The second transistor 234 may make the latch node QT a low level when the third reset signal QTRST is at a high level while the sensing node SO is at a high level. The third transistor 235 may have a drain terminal coupled to the ground terminal and a gate terminal coupled to the latch node QT. The fourth transistor 236 may have a drain terminal coupled to a source terminal of the third transistor 235, a source terminal coupled to a sensing node SO, and a gate terminal receiving the third transmission control signal TRANT as an input. The third transistor 235 and the fourth transistor 236 may cause a logic level of the sensing node SO to be low when the latch node QT and the third transmission control signal TRANT are at a high level.

The backup latch 230 may store the backup information at a low level by holding the latch node QT_N at a low level in response to the third set signal QTSET having a high level while the sensing node SO is at a high level. The backup latch 230 may store the backup information at a high level by holding the latch node QT_N at a high level in response to a third reset signal QTRST having a high level while the sensing node SO is at a high level.

The sensing information latch 240 may be configured to store a resultant signal from a verification operation, i.e., sensing information. The sensing information latch 240 may store the sensing information in response to a fourth transmission control signal TRANM_N, a fourth set signal QMSET, and a fourth reset signal QMRST. The sensing information latch 240 may include a first inverter 241, a second inverter 242, and a plurality of transistors, such as first through fourth transistors 243-246. The first inverter 241 may have an output terminal coupled to any one of a latch node pair QM, QM_N, for example, a latch node QM and an input terminal coupled to a latch node QM_N. The second inverter 242 may have an output terminal coupled with the latch node QM_N and an input terminal coupled with the latch node QM. The first transistor 243 may have a source terminal coupled to the fourth node ND4, a drain terminal coupled to the latch node QM_N, and a gate terminal receiving the fourth set signal QMSET as an input. The first transistor 243 may connect the latch node QM_N to the fourth node ND4 when the fourth set signal QMSET is at a high level. The first transistor 243 may make the latch node QM_N a low level when the fourth set signal QMSET is at a high level while the sensing node SO is at a high level. The second transistor 244 may have a source terminal coupled to the fourth node ND4, a drain terminal coupled to the latch node QM, and a gate terminal receiving the fourth reset signal QMRST as an input. The second transistor 244 may connect the latch node QM to the fourth node ND4 when the fourth reset signal QMRST is at a high level. The second transistor 244 may make the latch node QM a low level when the fourth reset signal QMRST is at a high level while the sensing node SO is at a high level. The third transistor 245 may have a drain terminal coupled to the ground terminal and a gate terminal coupled to the latch node QM. The fourth transistor 246 may have a drain terminal coupled to a source terminal of the third transistor 245, a source terminal coupled to a sensing node SO, and a gate terminal receiving the fourth transmission control signal TRANM_N as an input. The third transistor 245 and the fourth transistor 246 may make a logic level of the sensing node SO a low level when the latch node QM and the fourth transmission control signal TRANM_N are at a high level.

The sensing information latch 240 may store the sensing information at a low level by holding the latch node QM_N at a low level in response to the fourth set signal QMSET having a high level while the sensing node SO is at a high level. The sensing information latch 240 may store the sensing information at a high level by holding the latch node QM_N at a high level in response to the fourth reset signal QMRST having a high level while the sensing node SO is at a high level. The sensing information may be used as a signal indicating a result of a verification operation. If the sensing information is at a high level, it may be defined as fail, i.e., a program operation is not complete, and if the sensing information is at a low level, it may be defined as pass, i.e., a program operation is complete.

The precharge selection information latch 250 may be configured to store precharge selection information, i.e., information for selecting bit lines corresponding to remaining sub-verification operations other than verified sub-verification operations, among a plurality of sub-verification operations included in a main verification operation. The precharge selection information latch 250 may backup the sensing information in response to a discharge control signal SA_DISCH, a fifth set signal QSSET, and a fifth reset signal QSRST. The precharge selection information latch 250 may include a first inverter 251, a second inverter 252, and a plurality of transistors, such as first to fourth transistors 253-256. The first inverter 251 may have an output terminal coupled to any one of a latch node pair QS, QS_N, for example, a latch node QS and an input terminal coupled to a latch node QS_N. The second inverter 252 may have an output terminal coupled with the latch node QS_N and an input terminal coupled with the latch node QS. The first transistor 253 may have a source terminal coupled to the fourth node ND4, a drain terminal coupled to the latch node QS_N, and a gate terminal receiving the fifth set signal QSSET as an input. The first transistor 253 may connect the latch node QS_N to the fourth node ND4 when the fifth set signal QSSET is at a high level. The first transistor 253 may make the latch node QS_N a low level when the fifth set signal QSSET is at a high level while the sensing node SO is at a high level. The second transistor 254 may have a source terminal coupled to the fourth node ND4, a drain terminal coupled to the latch node QS, and a gate terminal receiving the fifth reset signal QSRST as an input. The second transistor 254 may connect the latch node QS to the fourth node ND4 when the fifth reset signal QSRST is high. The second transistor 254 may make the latch node QS a low level when the fifth reset signal QSRST is at a high level while the sensing node SO is at a high level. The third transistor 255 may have a drain terminal coupled to the ground terminal and a gate terminal coupled to the latch node QS. The fourth transistor 256 may have a drain terminal coupled to a source terminal of the third transistor 255, a source terminal coupled to the sensing node SO, and a gate terminal receiving the discharge control signal SA_DISCH as an input. The third transistor 255 and the fourth transistor 256 may cause a logic level of the sensing node SO to be low when the latch node QS and the discharge control signal SA_DISCH are at a high level.

The precharge selection information latch 250 may store the precharge selection information at a low level by holding the latch node QS_N at a low level in response to the fifth set signal QSSET having a high level while the sensing node SO is at a high level. The precharge selection information latch 250 may store the precharge selection information at a high level by holding the latch node QS_N at a high level in response to the fifth reset signal QSRST having a high level while the sensing node SO is at a high level.

The precharge selection information may be used as a signal to set which page buffers should be precharged for bit lines in the main verification operation. If the precharge selection information is at a high level, it may define that the corresponding page buffers correspond to the verification levels included in the main verification operation, and if the precharge selection information is at a low level, it may define that the corresponding page buffers do not correspond to the verification levels included in the main verification operation.

A first precharge control signal PRECHSO_N, a second precharge control signal SA_PRECH_N, a first sensing control signal SA_SENSE, a second sensing control signal PB_SENSE, and a third sensing control signal SA_CSOC, the first transmission control signal pair TRAN1, TRAN1_N, the first set signal Q1SET, the first reset signal Q1RST, the second transmission control signal pair TRAN2, TRAN2_N, the second set signal Q2SET, the second reset signal Q2RST, the third transmission control signal TRANT, the third set signal QTSET, the third reset signal QTRST, the fourth transmission control signal TRANM_N, the fourth set signal QMSET, the fourth reset signal QMRST, the discharge control signal SA_DISCH, the fifth set signal QSSET, and the fifth reset signal QSRST may be included in the page buffer control signals PBSIG described with reference to FIG. 3.

Figure 7:
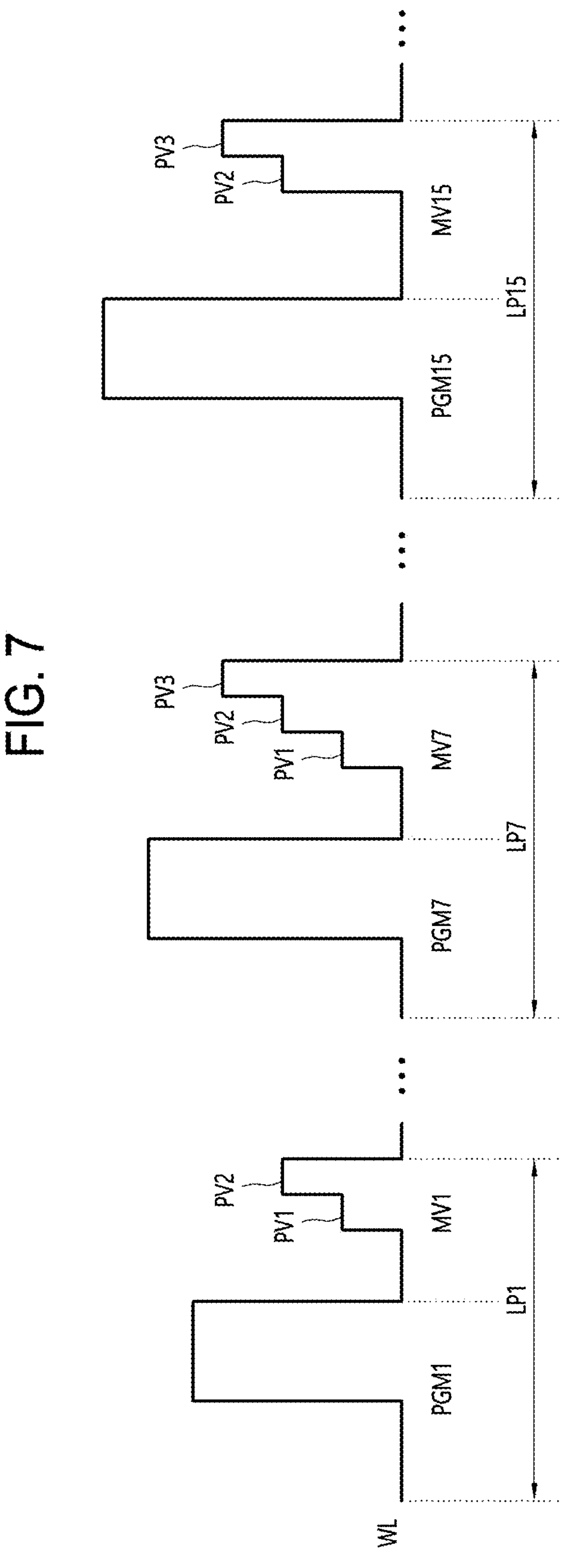
FIG. 7 is a diagram illustrating program and verification operations according to an embodiment of the present disclosure.

Referring to FIGS. 5 through 7, program and verification operations of a semiconductor memory apparatus according to an embodiment of the present disclosure will be described as follows.

FIG. 6 is a diagram illustrating data stored in the page buffer of FIG. 5 and verification levels, and FIG. 7 is a diagram illustrating program and verification operations according to an embodiment of the present disclosure.

Referring to FIG. 6, in response to an external data input, the latch node Q1_N of the first data latch 210 and the latch node Q2_N of the second data latch 220 may store a gray code corresponding to the externally input data. The gray code may correspond to the first to third verification levels PV1-PV3 or the verification-free level PV0, respectively.

When the gray code stored in the latch node Q1_N and the latch node Q2_N of the page buffer is '10', a sub-verification operation using the first verification level PV1 may verify whether the corresponding program operation passes or fails, If the gray code stored in the latch node Q1_N and the latch node Q2_N is '00', a sub-verification operation using the second verification level PV2 may verify whether the corresponding program operation passes or fails, and if the gray code stored in the latch node Q1_N and the latch node Q2_N is '01', a sub-verification operation using the third verification level PV3 may verify whether the corresponding program operation passes or fails.

The sub-verification operation must be preceded by an operation that precharges the corresponding bit lines. Therefore, an embodiment of the present disclosure may select bit lines corresponding to all verification levels included in the main verification operation according to the value of the gray code stored in the page buffer and cause them to be precharged simultaneously.

Referring to FIG. 7, a program operation according to an embodiment of the present disclosure may include a plurality of loops LP1, LP2, . . . , LP15, . . . .

Each of the loops may include a sub-program operation and a main verification operation. The main verification operation may include a plurality of sub-verification operations. For example, the main verification operations of the first loop LP1 to the sixth loop LP6 may comprise a first sub-verification operation using the first verification level PV1 and a second sub-verification operation using the second verification level PV2, the main verification operation of the seventh loop LP7 comprises first to third sub-verification operations using the first to third verification levels PV1-PV3, and the main verification operation of the fifteenth loop LP15 comprises second and third sub-verification operations using the second and third verification levels PV2, PV3.

First, the first sub-program operation PGM1 of the first loop LP1 may be performed to match the gray code stored in the latch node Q1_N and the latch node Q2_N. In the first sub-program operation PGM1, a program voltage is applied to selected word lines WL to raise threshold voltages of memory cells.

The first main verification operation MV1 may then be performed. The first main verification operation MV1 may include a bit line setup operation, a first sub-verification operation using the first verification level PV1 and a second sub-verification operation using the second verification level PV2.

As the bit line setup operation, a selective bit line simultaneous precharge method is applied, which is different from the conventional all bit line precharge method and selective bit line sequential precharge method. In order to proceed with the selective bit line simultaneous precharge method, the bit line setup operation may include an operation to select the bit lines to be precharged simultaneously among all bit lines (hereinafter referred to as a preliminary setup operation). The bit line setup operation may include a preliminary setup operation and a main setup operation.

The preliminary setup operation may include at least one of a first preliminary setup operation selecting page buffers corresponding to a first verification level PV1 from the total page buffers, a second preliminary setup operation selecting page buffers corresponding to a second verification level PV2 from the total page buffers, and a third preliminary setup operation selecting page buffers corresponding to a third verification level PV3 from the total page buffers.

The first main verification operation MV1 applies only the first verification level PV1 and the second verification level PV2, and the first preliminary setup operation and the second preliminary setup operation may be performed as the preliminary setup operation because the first verification level PV1 and the second verification level PV2 are applied first. Each of the first preliminary setup operation and the second preliminary setup operation may include an operation to reset the backup information.

The first preliminary setup operation may be performed using the first precharge control signal PRECHSO_N, the first transmission control signal TRAN1, the second transmission control signal TRAN2_N, and the third reset signal QTRST, and the detailed operation is as follows. First, the first precharge control signal PRECHSO_N in the form of a low pulse is input to precharge the sensing node SO to a high level, i.e., the power supply voltage VCORE level. The latch node Q1_N and the latch node Q2_N of the page buffers corresponding to the first verification level PV1 are stored with a gray code of '10'. Therefore, by applying the first transmission control signal TRAN1, the second transmission control signal TRAN2_N, and the third reset signal QTRST in the form of a high pulse, the sensing node SO of the page buffer having a gray code that is stored as '10' is maintained at a high level. Because the sensing node SO is at a high level, the backup information, i.e., a logic level of the latch node QT_N, may be reset to a high level. On the other hand, the sensing node SO of the page buffers having a gray code that is not stored as '10' transitions to a low level. Because the sensing node SO is at a low level, the backup information retains its previous value.

The second preliminary setup operation may be performed using the first precharge control signal PRECHSO_N, the first transmission control signal TRAN1_N, the second transmission control signal TRAN2_N, and the third reset signal QTRST, and the detailed operation is as follows. First, the first precharge control signal PRECHSO_N in the form of a low pulse is input to precharge the sensing node SO to a high level, i.e., the power supply voltage VCORE level. The latch node Q1_N and the latch node Q2_N of the page buffers corresponding to the second verification level PV2 are stored with a gray code of '00'. Therefore, by applying the first transmission control signal TRAN1_N, the second transmission control signal TRAN2_N, and the third reset signal QTRST in the form of a high pulse, the sensing node SO of the page buffer having a gray code that is stored as '00' is maintained at a high level. Because the sensing node SO is at a high level, the backup information may be reset to a high level. On the other hand, the sensing node SO of the page buffers having a gray code that is not stored as '00' transitions to a low level. Because the sensing node SO is at a low level, the backup information retains its previous value.

The main setup operation may be accomplished by storing the backup information stored in the backup latch 230 into the precharge selection information latch 250. The main setup operation may be performed using the first precharge control signal PRECHSO_N, the fifth set signal QSSET, the third transmission control signal TRANT, and the fifth reset signal QSRST. The first precharge control signal PRECHSO_N in the form of a low pulse is input to precharge the sensing node SO to a high level, i.e., the power supply voltage VCORE level. In the first preliminary setup operation and the second preliminary setup operation described above, the backup information is reset to a high level. Because the backup information is at a high level, a logic level of the precharge selection information, i.e., a logic level of the latch node QS_N, may be set to a high level by sequentially applying the fifth set signal QSSET, the third transmission control signal TRANT, and the fifth reset signal QSRST in the form of a high pulse.

Subsequently, a first sub-verification operation using the first verification level PV1 and a second sub-verification operation using the second verification level PV2 may be performed. The first sub-verification operation may include a selective bit line simultaneous precharge operation, an evaluation operation, a first verification level masking operation, and a sensing operation.

The selective bit line simultaneous precharge operation may be performed using a second precharge control signal SA_PRECH_N, a first sensing control signal SA_SENSE, a second sensing control signal PB_SENSE, a third sensing control signal SA_CSOC, and a discharge control signal SA_DISCH, the detailed operations of which are as follows. By maintaining the second precharge control signal SA_PRECH_N at a low level and maintaining the first sensing control signal SA_SENSE, the second sensing control signal PB_SENSE, the third sensing control signal SA_CSOC, and the discharge control signal SA_DISCH at a high level, the second switch 262 of the page buffer in which the precharge selection information is stored at a high level remains turned on, and the second switch 262 of the page buffer in which the precharge selection information is stored at a low level remains turned off. Thus, the bit lines BL coupled with all of the page buffers corresponding to the first verification level PV1 and the second verification level PV2, i.e., the page buffers in which the precharge selection information is stored at a high level, may be precharged to the power supply voltage VCORE level simultaneously. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The evaluation operation may be an operation to evaluate potential variations of the sensing node SO based on the program state of the memory cells. The evaluation operation may be accomplished by transitioning the second precharge control signal SA_PRECH_N to a high level. Because the second precharge control signal SA_PRECH_N is at a high level, the third switch 263 may be turned off and the potential of the sensing node SO may change accordingly depending on the program state of the memory cells coupled with the bit lines BL.

The first verification level masking operation may be an operation to select only the page buffers coupled with the bit lines BL corresponding to the first verification level PV1 among the bit lines BL precharged by the selective bit line simultaneous precharge operation. The first verification level masking operation may be accomplished by transitioning the first transmission control signal TRAN1 and the second transmission control signal TRAN2_N to a high level. Because the first transmission control signal TRAN1 and the second transmission control signal TRAN2_N are at a high level, the sensing nodes SOs of the page buffers corresponding to the first verification level PV1 remain at a high level, while the sensing nodes SOs of the page buffers corresponding to the second verification level PV2 are transitioned to a low level.

The sensing operation may be an operation to detect whether the first sub-verification operation using the first verification level PV1 passes or fails. The sensing operation may be accomplished by transitioning the first sensing control signal SA_SENSE to a low level and applying the fourth set signal QMSET with a high level. Because the first sensing control signal SA_SENSE is at a low level and the fourth set signal QMSET is at a high level, when the sensing node SO is at a high level, the sensing information, i.e., a logic level of the latch node QM_N, may be stored at a low level.

The second sub-verification operation may include a sensing node recovery operation, an evaluation operation, a second verification level masking operation, and a sensing operation, except for a selective bit line simultaneous pre-charge operation, unlike the first sub-verification operation.

The sensing node recovery operation may be an operation to restore the sensing nodes SOs of the page buffers corresponding to the second verification level PV2 to the power supply voltage VCORE level. The sensing node recovery operation may be accomplished by transitioning the second precharge control signal SA_PRECH_N to a low level and applying the first sensing control signal SA_SENSE with a high level. Because the second precharge control signal SA_PRECH_N is at a low level and the first sensing control signal SA_SENSE is at a high level, the sensing nodes SOs of the page buffers in which the precharge selection information is stored at a high level may be restored to the power supply voltage VCORE level.

The evaluation operation may be performed in the same manner as the first sub-verification operation.

The second verification level masking operation may be an operation to select only the page buffers coupled with the bit lines BL corresponding to the second verification level PV2 among the bit lines BL precharged by the previously performed selective bit line simultaneous precharge operation. The second verification level masking operation may be accomplished by transitioning the first transmission control signal TRAN1_N and the second transmission control signal TRAN2_N to a high level. Because the first transmission control signal TRAN1_N and the second transmission control signal TRAN2_N are at a high level, the sensing nodes SOs of the page buffers corresponding to the second verification level PV2 remain at a high level, while the sensing nodes SOs of the page buffers corresponding to the first verification level PV1 are transitioned to a low level.

The sensing operation is performed in the same manner as the first sub-verification operation, and the sensing information of the page buffers corresponding to the second verification level PV2 may be updated accordingly.

The loops determined may be performed sequentially in the above-described manner. In this case, when one loop is completed and another loop is performed, a selective bit line backup operation may be performed to backup a verification result of the previous loop, i.e., sensing information. The selective bit line backup operation may be performed by storing sensing information stored in the sensing information latch 240 as backup information in the backup latch 230. Thus, the backup latch 230 may store sensing information according to the most recent loop as backup information.

The selective bit line backup operation may be performed using the first precharge control signal PRECHSO_N, the fourth transmission control signal TRANM_N, and the third set signal QTSET. As the first precharge control signal PRECHSO_N of a low level is input, the sensing node SO is precharged to the power supply voltage VCORE level. As the fourth transmission control signal TRANM_N of a high level is input, the sensing node SO may be transitioned to a low level when the sensing information is at a high level, and the sensing node SO may be maintained at a high level when the sensing information is at a low level. When the third set signal QTSET of a high level is input, the backup information may be stored at a low level if the sensing node SO is at a high level, and the backup information may be maintained at the previous value if the sensing node SO is at a low level.

The seventh sub-program operation PGM7 of the seventh loop LP7 may be performed in the manner described above. In the seventh sub-program operation PGM7, a program voltage is applied to the selected word lines WL to increase threshold voltages of the memory cells. Following the seventh sub-program operation PGM7, a selective bit line backup operation may be performed.

The main verification operation MV7 of the seventh loop LP7 comprises first to third sub-verification operations utilizing the first to third verification levels PV1-PV3. In the seventh loop LP7, the third verification level PV3 is applied for the first time, so that a third preliminary setup operation may be performed. The third preliminary setup operation may include an operation to reset the backup information.

The third preliminary setup operation may be performed using the first precharge control signal PRECHSO_N, the first transmission control signal TRAN1_N, the second transmission control signal TRAN2, and the third reset signal QTRST, and the detailed operation is as follows. First, the sensing node SO is precharged to the supply voltage VCORE level as the first precharge control signal PRECHSO_N in the form of a low pulse is input. The latch node Q1_N and latch node Q2_N of the page buffers corresponding to the third verification level PV3 are stored with a gray code of '01'. Therefore, by applying the first transmission control signal TRAN1_N, the second transmission control signal TRAN2, and the third reset signal QTRST in the form of a high pulse, the sensing node SO of the page buffer having a gray code that is stored as '01' is maintained at a high level. Because the sensing node SO is at a high level, the backup information, i.e., a logic level of the latch node QT_N, may be reset to a high level. On the other hand, the sensing node SO of the page buffer having a gray code that is not stored as '01' transitions to a low level. Because the sensing node SO is at a low level, the backup information retains its previous value.

Then, the first sub-verification operation and the second sub-verification operation may be performed in the same way as the first loop LP1.

Then, the third sub-verification operation may be performed. The third sub-verification operation may include a sensing node recovery operation, an evaluation operation, a third verification level masking operation, and a sensing operation. The sensing node recovery operation, the evaluation operation, and the sensing operation may be performed in the same manner as the second sub-verification operation.

The third verification level masking operation may be an operation to select only the page buffers coupled with bit lines BL corresponding to the third verification level PV3 among the bit lines BL precharged by the previously performed selective bit line simultaneous precharge operation. The third verification level masking operation may be accomplished by transitioning the first transmission control signal TRAN1_N and the second transmission control signal TRAN2 to a high level. Because the first transmission control signal TRAN1_N and the second transmission control signal TRAN2 are at a high level, the sensing nodes SOs of the page buffers corresponding to the third verification level PV3 remain at a high level, while the sensing nodes SOs of the page buffers corresponding to the first verification level PV1 and the second verification level PV2 are transitioned to a low level.

Upon completion of the seventh to 14th loops LP7-LP14, the program operations of all memory cells corresponding to the first verification level PV1 may be determined to be passed. Therefore, the sensing information of all page buffers corresponding to the first verification level PV1 may be stored at a low level. The sensing information of a low level may be stored as the backup information of a low level by the selective bit line backup operation.

Then, the fifteenth sub-program operation PGM15 and a fifteenth main verification operation MV15 according to the fifteenth loop LP15 may be performed.

First, a fifteenth sub-program operation PGM15 may be performed to match the gray code stored in the latch node Q1_N and the latch node Q2_N. In the fifteenth sub-program operation PGM15, a program voltage is applied to the selected word lines WL to raise threshold voltages of the memory cells.

A fifteenth main verification operation MV15 may then be performed. The fifteenth main verification operation MV1 may be a bit line setup operation and second and third sub-verification operations using the second and third verification levels PV2, PV3 excluding the first verification level PV1.

Because the second and third verification levels PV2, PV3 have already been applied in the previous loop, i.e., they are not applied for the first time, a bit line setup operation may only include a main setup operation. By the main setup operation, the precharge selection information of all page buffers corresponding to the first verification level PV1 may be stored at a low level, while the precharge selection information of all page buffers corresponding to the second verification level PV2 and the third verification level PV3 may be stored at a high level.

The second sub-verification operation of the fifteenth loop LP15 may be performed in the same manner as the first sub-verification operation of the seventh loop LP7, and the third sub-verification operation of the fifteenth loop LP15 may be performed in the same manner as the second sub-verification operation of the seventh loop LP7.

During the second sub-verification operation of the fifteenth loop LP15, all bit lines BL coupled with all page buffers corresponding to the second verification level PV2 and the third verification level PV3, except for the page buffers corresponding to the first verification level PV1, may be precharged to the power supply voltage VCORE level simultaneously.

The embodiment of the present disclosure described above applies a selective bit line simultaneous precharge method, which allows only the bit lines coupled with the page buffers corresponding to the verification levels determined for each program and each loop of the verification operation to be precharged simultaneously.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A semiconductor memory apparatus comprising:
   - a plurality of bit lines;
   - a plurality of page buffers each coupled with the plurality of bit lines and configured to operate in response to a plurality of page buffer control signals; and
   - a page buffer control circuit configured to generate the plurality of page buffer control signals to perform program and verification operations comprising a plurality of loops,
   - wherein the page buffer control circuit is configured to use the plurality of page buffer control signals to simultaneously precharge bit lines coupled with page buffers, among the plurality of page buffers, corresponding to remaining verification levels other than verification levels determined to be passed among a plurality of verification levels corresponding to each of the plurality of loops.

2. The semiconductor memory apparatus of claim 1, wherein each of the plurality of loops includes sub-program operation and a main verification operation comprising a plurality of sub-verification operations corresponding to the plurality of verification levels.

3. The semiconductor memory apparatus of claim 1, wherein each of the plurality of page buffers includes a data latch set, a backup latch, a sensing information latch, and a precharge selection information latch coupled in parallel to a sensing node.

4. The semiconductor memory apparatus of claim 3, wherein the data latch set includes a plurality of data latches and each data latch from the plurality of data latches are configured to store at least one bit of data.

5. The semiconductor memory apparatus of claim 3, wherein the sensing information latch is configured to store as sensing information whether a plurality of sub-verification operations corresponding to the plurality of verification levels pass or fail.

6. The semiconductor memory apparatus of claim 5, wherein the backup latch is configured to store the sensing information as backup information.

7. The semiconductor memory apparatus of claim 3, wherein the precharge selection information latch is configured to store precharge selection information for setting page buffers corresponding to the plurality of verification levels.

8. A semiconductor memory apparatus comprising:
   - a bit line coupled to a sensing node through at least one switch;
   - a data latch set coupled with the sensing node and including a plurality of data latches, each data latch from the plurality of data latches configured to store at least one bit of data;
   - a sensing information latch coupled with the sensing node, and configured to store as sensing information whether a plurality of sub-verification operations corresponding to a plurality of verification levels pass or fail;
   - a backup latch coupled with the sensing node and configured to store the sensing information as backup information;
   - a precharge selection information latch coupled with the sensing node and configured to store precharge selection information; and
   - a page buffer control circuit configured to control the data latch set and the backup latch such that the backup information is reset in accordance with the data, configured to control the backup latch and the precharge selection information latch such that the backup information is stored as the precharge selection information, and configured to control the at least one switch to precharge the bit line in accordance with the precharge selection information.

9. The semiconductor memory apparatus of claim 8, wherein the data latch set, the backup latch, the sensing information latch, and the precharge selection information latch are coupled in parallel to the sensing node.

10. The semiconductor memory apparatus of claim 8, wherein the page buffer control circuit is configured to control the data latch set to transition the sensing node to a low level based on the data after precharging the bit line.

11. A semiconductor memory apparatus comprising:

a plurality of bit lines;

a plurality of page buffers, a sensing node of which being coupled to the plurality of bit lines through at least one switch, and configured to store data, backup information, sensing information, and precharge selection information in response to a plurality of page buffer control signals; and a page buffer control circuit configured to generate the plurality of page buffer control signals to perform program and verification operations comprising a plurality of loops, wherein the page buffer control circuit is configured to perform a bit line setup operation including at least one of a preliminary setup operation and a main setup operation to select page buffers corresponding to a plurality of verification levels among the plurality of page buffers, and configured to perform a plurality of sub-verification operations utilizing each of the plurality of verification levels while simultaneously precharging bit lines coupled with page buffers corresponding to remaining verification levels other than verification levels determined to be passed among the plurality of verification levels among the plurality of bit lines.

12. The semiconductor memory apparatus of claim 11, wherein the page buffer control circuit is configured to perform the bit line setup operation including the preliminary setup operation and the main setup operation, when there is a verification level applied first among the plurality of verification levels, and configured to perform the bit line setup operation including only the main setup operation, when there is no verification level applied first among the plurality of verification levels.

13. The semiconductor memory apparatus of claim 11, wherein the preliminary setup operation comprises resetting the backup information according to the data.

14. The semiconductor memory apparatus of claim 11, wherein the main setup operation comprises storing the backup information as the precharge selection information.

15. The semiconductor memory apparatus of claim 11, wherein the page buffer control circuit is configured to perform a verification level masking operation that selects only page buffers coupled with bit lines corresponding to current verification level among the simultaneously precharged bit lines.

16. The semiconductor memory apparatus of claim 11, wherein the page buffer control circuit is configured to perform a sensing node recovery operation that precharges the sensing node for each of subsequent sub-verification operations after performing a first sub-verification operation of the plurality of sub-verification operations.

17. A method for controlling a verification operation of a semiconductor memory apparatus comprising a plurality of bit lines; a plurality of page buffers each coupled with the plurality of bit lines and configured to store data, backup information, sensing information and precharge selection information; and a page buffer control circuit configured to control the plurality of page buffers to perform program and verification operations comprising a plurality of loops, the method comprising:

performing a preliminary setup operation of resetting the backup information based on the data;

performing a main setup operation of storing the backup information as the precharge selection information; and performing a selective bit line simultaneous precharge operation to simultaneously precharge bit lines coupled with page buffers corresponding to a plurality of verification levels corresponding to each of the plurality of loops among the plurality of page buffers according to the precharge selection information.

18. The method of claim 17, wherein the preliminary setup operation is performed only when there is a verification level applied first among the plurality of verification levels.

19. The method of claim 17, further comprising further comprising performing a verification level masking operation to select only page buffers coupled with bit lines corresponding to current verification level among the simultaneously precharged bit lines, after performing the selective bit line simultaneous precharge operation.

20. The method of claim 19, further comprising performing a sensing operation to detect whether a sub-verification operation passes using the current verification level, after performing the verification level masking operation.

21. The method of claim 20, further comprising performing a sensing node recovery operation to precharge the sensing node prior to performing a sub-verification operation, after performing the sensing operation.

22. The method of claim 21, further comprising performing a selective bit line backup operation to store the sensing information as the backup information when one loop among the plurality of loops is completed and another loop among the plurality of loops is performed.

* * * * *